United States Patent [19]
Van Bennekom et al.

[11] 4,237,418
[45] Dec. 2, 1980

[54] ELECTRICAL CURRENT INDICATING METER

[75] Inventors: Carl F. Van Bennekom, Green Valley, Ariz.; Donald E. Rogers, Lynn; Edward F. Scannell, Saugus, both of Mass.

[73] Assignee: General Electric Company, New York, N.Y.

[21] Appl. No.: 948,173

[22] Filed: Oct. 2, 1978

[51] Int. Cl.³ .............................................. G01R 1/20
[52] U.S. Cl. ................................ 324/150; 324/154 R; 324/154 PB
[58] Field of Search ............... 324/150, 151 R, 151 A, 324/154 R, 154 PB

[56] References Cited

U.S. PATENT DOCUMENTS

| 1,165,745 | 12/1915 | Benecke | 324/150 |
| 2,887,657 | 5/1959 | Lamb et al. | 324/154 R |

*Primary Examiner*—Michael J. Tokar
*Attorney, Agent, or Firm*—W. C. Bernkopf; P. E. Rochford

[57] ABSTRACT

A compact and symmetrically arranged construction for electrical current indicating meters of small size. The novel construction for a meter comprises a unitary frame member combined with concentrically arranged components.

5 Claims, 4 Drawing Figures ary unit from dielectric organic polymeric materials, and therefore the attainment of many benefits and savings, including: obviating the need for separate dielectric insulating devices or means, such as blocks or washers, to electrically isolate units or circuits; enabling ultrasonic heading or staking to join and secure parts, and thereby eliminate hardware components such as fasteners; and permitting the integral molding in situ of screw threads for attaching adjustable components rather than the use of a separate component such as an inserted tapped bushing.

ELECTRICAL CURRENT INDICATING METER

CROSS-REFERENCE TO RELATED APPLICATIONS

The subject application is related to the application of Edward F. Scannell and Edward D. Orth entitled Shielded Electrical Current Indicating Meter, filed Oct. 2, 1978, Ser. No. 948,197, and assigned to the same assignee as the subject application. This application also relates to the application of William J. Schultz and Carl F. Van Bennekom entitled Magnetic System For Electrical Current Indicating Meter, filed Oct. 2, 1978, Ser. No. 948,172, and assigned to the same assignee as the subject application.

This application further relates to the application of William J. Schultz and Carl F. Van Bennekom entitled Pivot Insert Method And Article, filed Oct. 2, 1978, Ser. No. 948,191, and assigned to the same assignee as the subject application.

Further this application relates to the application of Edward F. Scannell entitled Adjustable Spring Regulator For Setting Indicating Instrument Pointer, filed Oct. 2, 1978, Ser. No. 948,174, and assigned to the same assignee as the subject application.

Still further this application relates to the application of Edward F. Scannell and Donald E. Rogers entitled Means For Adjusting The Zero Point Setting Of A Meter, filed Oct. 2, 1978, Ser. No. 948,171, and assigned to the same assignee as the subject application.

BACKGROUND OF THE INVENTION

The invention of this disclosure relates to small electrical current indicating meters of the general type disclosed in U.S. Pat. Nos. 3,621,393 and 4,064,457, and the references cited therein.

SUMMARY OF THE INVENTION

This invention comprises a new and improved, symmetrical construction for small sized electrical current indicating meters comprising the combination of a unitary frame member with concentrically arranged components which provide greater versatility and multiple functions in the assembly and performance of the meter and savings in the manufacture thereof.

OBJECTS OF THE INVENTION

It is a primary object of this invention to provide a new construction for electrical current indicating meters which is more versatile and flexible in manufacture and service.

It is also an object of this invention to provide a small compact electrical current indicating meter constructed of integrated composite parts or units which simplify manufacture and assembly, and render the meter more economical and versatile in service.

It is a further object of this invention to provide an improved construction for electrical current indicating meters which renders it feasible and advantageous to use dielectric organic polymeric materials to form integrated or unitary composite parts or units which lend greater versatility and flexibility in production and assembly of such meters, and a reduction in the number of parts or components and in turn costs.

It is a still further object of this invention to provide a compact electrical current indicating meter construction which advantageously lends itself to the use of structural parts or components molded in a single or unitary unit from dielectric organic polymeric materials, and therefore the attainment of many benefits and savings, including: obviating the need for separate dielectric insulating devices or means, such as blocks or washers, to electrically isolate units or circuits; enabling ultrasonic heading or staking to join and secure parts, and thereby eliminate hardware components such as fasteners; and permitting the integral molding in situ of screw threads for attaching adjustable components rather than the use of a separate component such as an inserted tapped bushing.

DESCRIPTION OF A PREFERRED EMBODIMENT

Figure 1:
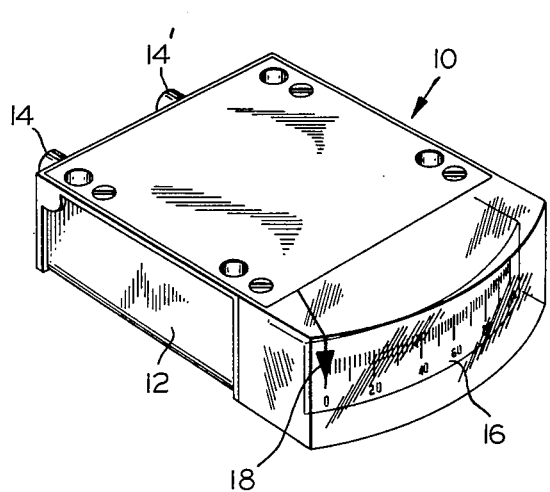
FIG. 1 is a perspective view of the electrical current indicating meter of this invention.
Figure 2:
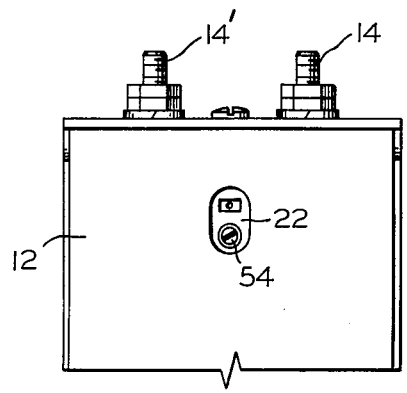
FIG. 2 is a partial bottom view of the meter of FIG. 1.

Referring to the drawings, FIG. 1 shows a meter product 10 of a preferred embodiment of this invention, comprising a housing 12, provided with terminals 14 and 14' for making electrical connections with the meter, and a visual scale 16 in association with a pointer 18 for indicating the measured quantity of electrical current determined by the meter.

Figure 3:
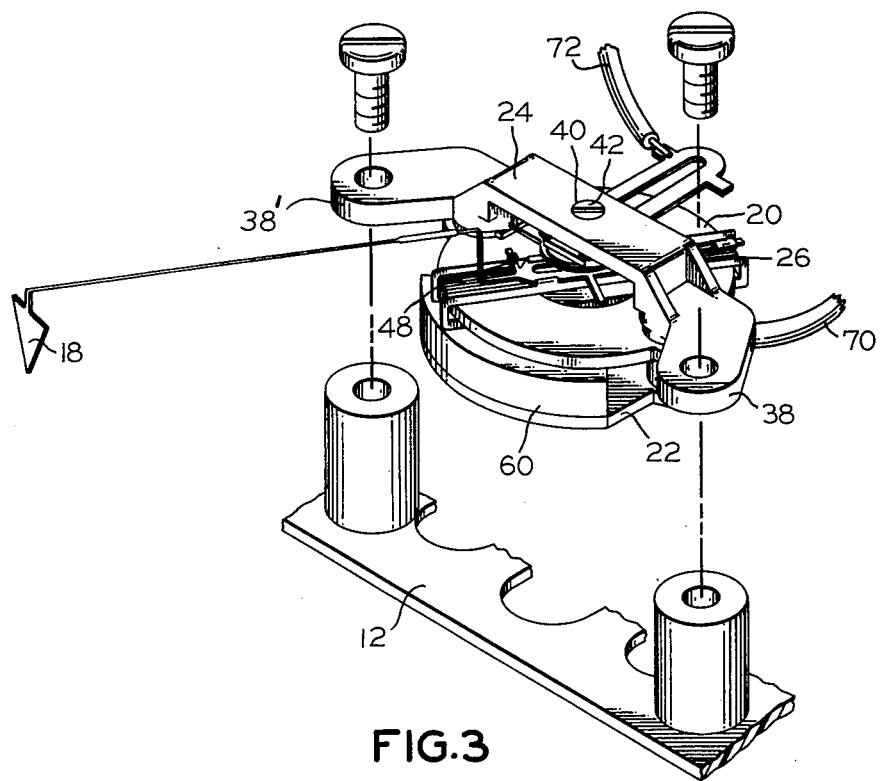
FIG. 3 is a partially exploded view showing the assemblage of the primary current indicating mechanism of the meter and the means for mounting same in a housing.
Figure 4:
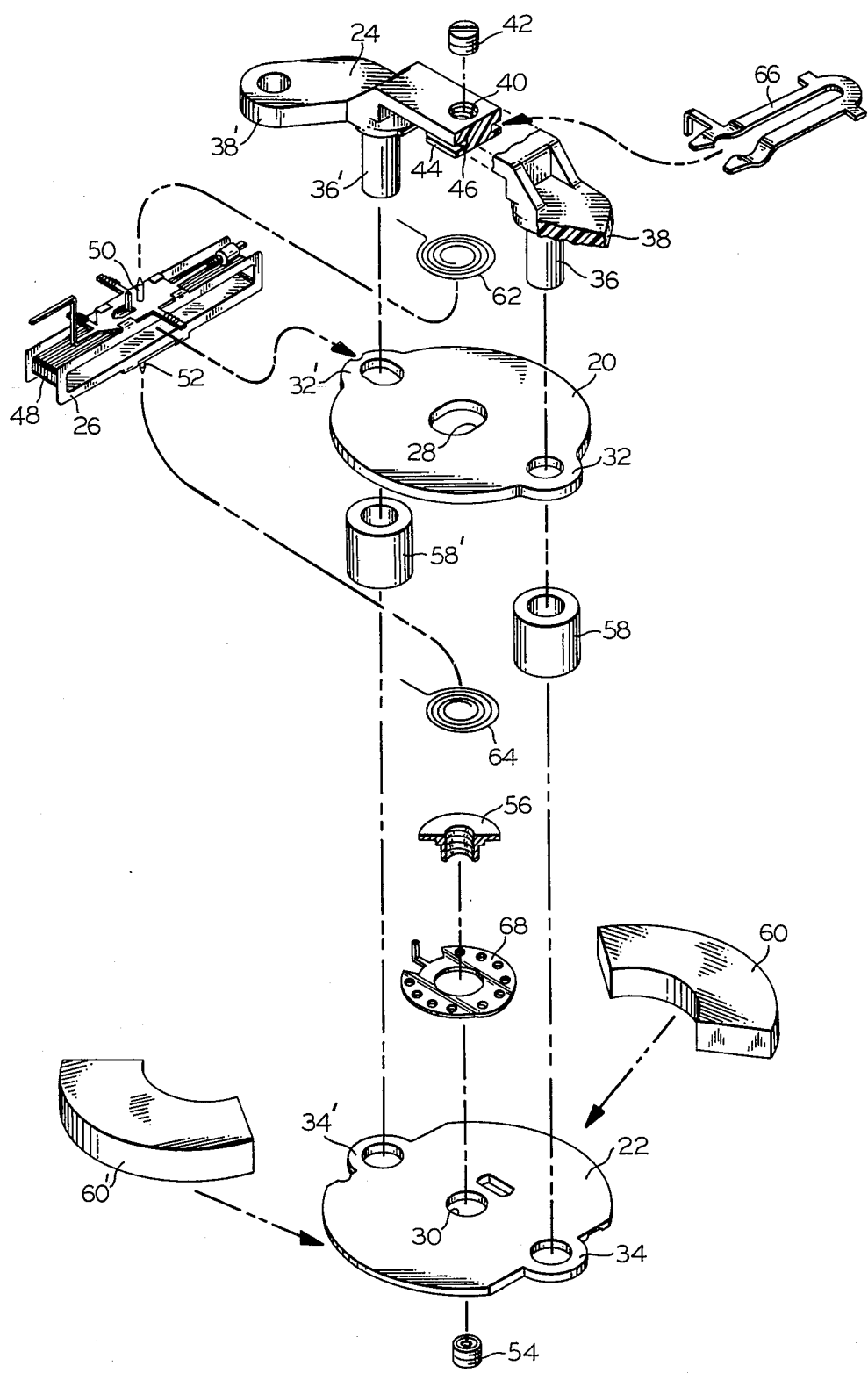
FIG. 4 is a fully exploded view of the primary current indicating mechanism.

The primary electrical current measuring mechanism, or the basic units therefor of a preferred embodiment of the meter construction of this invention, as shown in detail in FIGS. 3 and 4, comprises a pair of spaced apart, parallel flux plates 20 and 22 formed from a suitably magnetic flux conducting metal or "soft" magnetic material such as iron or soft steel; a frame member 24 formed as a unitary body molded from a non-magnetic organic polymeric material; and a rotor assembly 26.

Spaced apart, parallel flux plates 20 and 22 of the preferred embodiment are of a generally flat, ellipsoidal or disk-like configuration to easily accommodate completely within their intermediate perimeter one or more magnet units of various size or capacity. Each rounded or oval flux plate 20 and 22 is provided with a central orifice 28 and 30, respectively, and a pair of outward projecting perforated ears 32-32' and 34-34' for mounting in a predetermined spaced apart, parallel relationship with respect to each other, and the other components of the meter.

Unitary frame member 24 is provided with a pair of generally parallel studs 36-36' which are arranged to align with and pass through the perforations in ears 32-32' and 34-34' of plates 20 and 22, respectively, and thereby join and secure these components together in an appropriate spaced apart parallel relationship. Frame 24 is additionally preferably provided with a pair of laterally or outwardly extending arms 38-38', also perforated, for the mounting, such as with bolts, of the primary current measuring mechanism within a meter housing 12, or in an appropriate electrical device. Also, frame 24 is provided with a central orifice 40 having molded therein suitable threading for receiving a screw adjustable jewel bearing 42, and an integrally molded or formed washer-like element 44 comprising a projecting portion or boss having a circumferential groove 46 thereabout for cooperation with a regulator or adjusting means.

In accordance with this invention frame member 24 is molded as a unitary or integral body unit from a high strength and temperature resistant dielectric organic polymeric material, for example, a glass filled blend of polyphenylene oxide and polystyrene, such as General Electric Company's NOREL plastic. Such a frame member and composition provides adequate structural integrity and heat resistance to retain the mechanical strength of its features such as molded or cut screw threads, over a long service life and/or under adverse conditions such as extensive exposure to high temperatures and vibrations.

Rotor assembly 26 comprises an electromagnetic coil 48 which is of apt dimensions and configuration to closely surround the ellipsoidal flux plate 20, a pointer 18, and a pair of oppositely extending pivot shafts or staffs 50 and 52 for mounting the overall assembly 26 for rotational movement back and forth in an arcuate path in the same plane as the flux plates 20 and 22. Pivots 50 and 52 are affixed to the rotor assembly at a location thereon approximately central to the length of the coil, and they respectively extend to and rest in screw adjusting jewel bearings 42 and 54. Bearing 42, as noted above, is threaded into frame member 24, and bearing 54 is threaded into a bushing 56 inserted in the central orifice 30 of flux plate 22 which is mounted on studs 36-36' the furthest from frame member 24, in parallel relationship with plate 20.

As shown in the drawings, in assembly, flux plate 20 is mounted closest to frame member 24 with the frame member studs 36-36' passing through the perforations or openings in its projecting ears 32-32', and flux plate 22 is similarly mounted parallel thereto farthest from frame member 24 with studs 36-36' also passing through the perforations or openings of its projecting ears 34-34'. Spacing posts or cylinders 58-58' can be used surrounding studs 36-36' and positioned intermediate the parallel flux plates 20 and 22 to provide a predetermined spacing between the plates. Thus, any required or desired distance between the pair of parallel flux plates 20 and 22 can readily be unerringly achieved in assembly and positively maintained, or changed, by the use of spacing posts of appropriate dimensions or length. Spacing posts 58-58' can be composed either of magnetic flux conducting material such as ferrous metal, or a nonmagnetic material such as a dielectric plastic, depending upon the particular requirements or needs of the magnetic flux system or circuit employed.

One or more magnet bodies, including permanent magnets, such as the pair of counterposed permanent magnets 60-60' illustrated, are positioned intermediate the flux plates 20 and 22 residing on the inner surface of flux plate 22 which is farthest from frame member 24, and there secured by any suitable means such as an adhesive. The number, configuration and positioning of magnets or magnet bodies should be arranged to attain optimum magnetic flux forces or strengths circulating through the flux system or circuit comprising flux conducting plates 20 and 22, and in turn past the electromagnetic coil 48 of rotor member 26. In a preferred embodiment two arcuate permanent magnets 60 and 60' are symmetrically deployed on each side of the central coil pivot point or pivot 52 with their polarity aptly aligned to produce a uniform flux field or fields of suitable direction(s) and intensity through the system. For example, the two magnets aligned with opposite polarity of N facing S are arranged on opposite sides of the pivot point or pivot shaft 52 extending from the rotor assembly 26 to the bearing 54 affixed to flux plate 22 farthest from the frame member 24.

The spacing between parallel flux plates 20 and 22 is such as to provide a sufficient air gap or space between the magnet or magnets 60 positioned on the inner surface of flux plate 22, and the inner surface of flux plate 20 to aptly accommodate the free rotational movement of coil 48, or the intervening portion thereof, through the gap without contacting either the magnets of the flux plates.

Upper and lower control springs 62 and 64 bear against the rotor assembly 26 to appropriately bias its alignment and pointer 18 in relation to the scale 16, and to provide suitable torque resistance to rotary movement of the rotor assembly when induced by electromagnetic forces resulting from current flow through the coil, and thereafter return the rotor assembly and its pointer when the forces are terminated.

A regulator arm 66, which connects with washer element 44 of frame 24, is provided to adjust or synchronize the terminal position or setting of the rotor assembly 26 with its pointer 18 at a given indice, such as zero of the scale 16.

Also, an adjustable spring regulator disc 68 can be included to change the tension of the spring 64.

Electrical conductors for carrying current to the electrically sensitive or activated meter components, such as the electromagnetic coil, for measurement, are provided by insulated wires 70 and 72 shown in FIG. 3. In a preferred embodiment, wires 70 and 72, respectively, connect terminals 14 and 14' with flux plate 22 and with regulator arm 66 which in turn makes electrical contact with the electromagnetic coil 48 through upper control spring 62.

The electrical current indicating and measuring meter mechanism or apparatus of this invention, as will be apparent to those skilled in this art, operates on the D'Arsonval principle which is well known and understood in the art, for instance, note the disclosure of U.S. Pat. Nos. 3,621,393 and 4,064,457.

However, the distinctive construction for the meter of this invention places the pivotal position and pivot means for the rotor assembly substantially intermediate the length of the electromagnetic coil and generally concentric with the flux plates, and it also provides for several magnet units symmetrically arranged around the pivotal position and the coil. Thus, the end portions of the electromagnetic coil extend approximately equally outward from the central pivotal position in opposite directions with each portion of the coil projecting over or into the area of influence or force of the flux field of one of the two, or more, magnetic units. Then, by providing the two, or multiples of two, so located magnet units arranged with polarities opposite each other, their respective magnetic flux inducing deflective force or influence acting upon each portion of the coil on opposite sides of the pivot point is in effect additive or accumulative with respect to the rotational force upon the rotatable electromagnetic coil and the rotor assembly carrying the same. In other words, the oppositely directed forces are so deployed on each side of the central pivotal point of the rotatable coil and symmetrical assembly so as to cooperate and thereby effectively double the rotating deflective force upon the coil, as well as balance the torque and mechanical pressures on the pivot structure.

The distinctive construction and arrangement of components of the electrical current indicating meter of this invention, including the unitary frame member of a dielectric body in combination with the elipsoidal flux plates mounted thereby and the concentrically positioned magnetic coil of the rotor assembly and symmetrical arrangement of such components, including the magnet bodies, wherein the frame member provides a central bearing for the coil pivot, provides a meter device with many advantages and improvements. For instance, the combination including the frame member provides a maximum distance within the meter housing for the spacing of the magnetic coil pivot bearing which contributes to greater stability or freedom from play in the pointer arm. Also, the frame member construction in the overall combination provides for a single unitary molded unit to perform many functions including a supporting structure or frame for the simple and unerring assembly, positioning and mounting of the components in their precise arrangement with respect to each other and with the housing. Moreover, the frame can be integrally molded as a single body comprising portions which itself perform many functions in addition to providing an economical component to produce.

What we claim as new and desire to secure by Letters Patent of the United States is:

1. In an electrical current indicating meter mechanism having an inner and outer parallel flux plate, a pair of pivots, a rotor assembly having a coil surrounding said inner flux plate, said rotor assembly being mounted for rotational movement in the same plane as the inner flux plate, a pair of bearings, at least one permanent magnet positioned on said outer flux plate and means for supplying current to the coil of the rotor assembly, wherein the improvement comprises two spacer posts, a unitary frame member molded from an organic polymeric material having a pair of parallel projecting studs for securing thereto the inner and outer parallel flux plates separated by the two spacer posts mounted on said studs, said rotor assembly being mounted for rotation on said pair of pivots with one of said pivots extending to the bearing affixed to the frame member and the other pivot extending to the bearing affixed to the outer flux plate.

2. In an electrical current indicating meter mechanism having a regulator arm, an inner and outer parallel flux plate, a pair of pivots, a rotor assembly having a coil surrounding said inner flux plate, said rotor assembly being mounted for rotational movement in the same plane as the inner flux plate, a pair of bearings, at least one permanent magnet positioned on said outer flux plate and means for supplying current to the coil of the rotor assembly, wherein the improvement comprises two spacer posts, a unitary frame member molded from an organic polymeric material provided with an integrally molded boss having a circumferential groove thereabout for mounting said regulator arm, said frame member having a threaded orifice for screw adjustable mounting of one of said bearings, said frame member also having a pair of parallel projecting studs for securing thereto the inner and outer parallel flux plates separated by the two spacer posts mounted on said studs, said rotor assembly being mounted for rotation on said pair of pivots with one of said pivots extending to the bearing affixed to the frame member and the other pivot extending to the bearing affixed to the outer flux plate.

3. The meter mechanism of claim 1 or 2, wherein the frame member is provided with a pair of outwardly extending perforated arms for mounting.

4. The meter mechanism of claim 1 or 2, wherein the frame member is integrally molded from a glass filled blend of polyphenylene oxide and polystyrene.

5. The meter mechanism of claim 1, wherein the frame member is provided with a threaded orifice for screw adjustable mounting of a bearing.

* * * * *